United States Patent
Lopez (10) Patent No.: US 12,027,651 B2
(45) Date of Patent: Jul. 2, 2024

(54) LATERAL LIGHT COLLECTION AND WAVELENGTH CONVERSION FOR A LIGHT-EMITTING DEVICE

(71) Applicant: LUMILEDS LLC, San Jose, CA (US)

(72) Inventor: Toni Lopez, Vaals (NL)

(73) Assignee: Lumileds LLC, San Jose, CA (US)

( * ) Notice: Subject to any disclaimer, the term of this patent is extended or adjusted under 35 U.S.C. 154(b) by 304 days.

(21) Appl. No.: 17/142,964

(22) Filed: Jan. 6, 2021

(65) Prior Publication Data
US 2022/0216378 A1 Jul. 7, 2022

(51) Int. Cl.
H01L 33/50 (2010.01)
H01L 33/00 (2010.01)

(52) U.S. Cl.
CPC .......... H01L 33/505 (2013.01); H01L 33/005 (2013.01); H01L 33/508 (2013.01); H01L 2933/0041 (2013.01)

(58) Field of Classification Search
CPC ..... H01L 33/50–508; H01L 2933/0041; H01L 33/005; H01L 33/46; H01L 33/502; H01L 33/504; H01L 33/505
See application file for complete search history.

(56) References Cited

U.S. PATENT DOCUMENTS

| | | | |
|---|---|---|---|
| 7,939,843 B2 | 5/2011 | Haruna et al. | |
| 7,955,531 B1 | 6/2011 | Khanarian | |
| 9,076,937 B2 | 7/2015 | Akimoto et al. | |
| 9,835,310 B2 | 12/2017 | Tamaki et al. | |
| 9,966,502 B2 | 5/2018 | Cheng et al. | |
| 10,008,642 B2 | 6/2018 | Seo et al. | |
| 10,230,027 B2 | 3/2019 | Chen | |
| 11,177,420 B2 | 11/2021 | Lopez-Julia et al. | |
| 11,237,469 B2 * | 2/2022 | Hashizume | G03B 21/204 |
| 11,257,986 B2 | 2/2022 | Meyer et al. | |
| 2005/0093008 A1 | 5/2005 | Suehiro et al. | |
| 2013/0257264 A1 * | 10/2013 | Tamaki | F21V 13/08 313/503 |
| 2013/0335807 A1 | 12/2013 | Arsenault et al. | |
| 2015/0280078 A1 * | 10/2015 | Yen | H01L 33/505 257/13 |

(Continued)

FOREIGN PATENT DOCUMENTS

| | | |
|---|---|---|
| KR | 10-2017-0121777 A | 11/2017 |
| KR | 10-2020-0134465 A | 12/2020 |
| TW | M453969 U * | 5/2013 |

OTHER PUBLICATIONS

English translation of TWM453969 U (Year: 2013).*

(Continued)

Primary Examiner — Latanya N Crawford Eason (57) ABSTRACT

A light-emitting device includes a substrate, a semiconductor diode structure, a wavelength-converting layer less than 50. microns thick with luminescent particles in an index-matched inorganic binder, optical sidewall coating, and an optical sidewall structure. The optical sidewall structure is interposed between substrate sidewalls and optical sidewall coating, and redirects side-propagating output light toward or within the wavelength-converting layer. The optical sidewall structure can be part of the wavelength-converting layer or part of an adhering layer between the substrate and the wavelength-converting layer.

19 Claims, 4 Drawing Sheets

(56) References Cited

U.S. PATENT DOCUMENTS

| | | | |
|---|---|---|---|
| 2017/0222102 A1* | 8/2017 | Cheng | H01L 33/60 |
| 2018/0122993 A1 | 5/2018 | Camras et al. | |
| 2019/0198727 A1* | 6/2019 | Shen | H01L 33/505 |
| 2019/0252460 A1* | 8/2019 | Andrews | H01L 33/62 |
| 2020/0411736 A1 | 12/2020 | Bechtel et al. | |
| 2021/0111320 A1 | 4/2021 | Lopez-Julia et al. | |
| 2022/0115566 A1 | 4/2022 | Meyer et al. | |

OTHER PUBLICATIONS

From the Korean Intellectual Property Office, Notification of Transmittal of the International Search Report and the Written Opinion of the International Searching Authority, or the Declaration, PCT/US2022/011276, dated Apr. 25, 2022, 10 pages.

\* cited by examiner

FIG. 1
PRIOR ART

| configuration | ligth emitting surface | relative flux gain |
|---|---|---|
| FIG. 1 | 1.060 mm square | 0.0% |
| FIGS. 4A/4B | 1.060 mm square | 1.5% |
| FIG. 2A w/o sidewall | 1.024 mm square | 3.7% |
| FIGS. 3A/3B | 1.060 mm square | 5.5% |
| FIGS. 2A/2B | 1.024 mm square | 6.1% |

LATERAL LIGHT COLLECTION AND WAVELENGTH CONVERSION FOR A LIGHT-EMITTING DEVICE

FIELD OF THE INVENTION

The field of the present invention relates to light-emitting devices. In particular, apparatus and methods are disclosed described herein for lateral light collection and wavelength conversion for a light-emitting device.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a different, typically longer wavelength. For such phosphor-converted LEDs ("pcLEDs"), the fraction of the light emitted by the LED that is absorbed by the phosphors depends on the amount of phosphor material in the optical path of the light emitted by the LED, e.g., on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

In a so-called chip-scale package, LED structure is formed on a transparent substrate, and the phosphor layer is on the opposite surface of the substrate. Output light from the LED propagates through the substrate and into the phosphor layer, while some light escapes through sidewalls of the substrate. An optical sidewall coating (e.g., titanium oxide or other suitable scattering particles in silicone or other transparent medium) obstructs propagation of such laterally propagating light, much of which is lost as useful output of the phosphor-converted LED.

SUMMARY

An inventive wavelength-converted light-emitting device comprises a substrate, a semiconductor diode structure, a wavelength-converting layer, an optical sidewall coating, and an optical sidewall structure. The substrate is substantially transparent and has opposite first and second surfaces and sidewalls connecting the first and second surfaces. The semiconductor diode structure is on the first surface of the substrate, and includes one or more light-emitting active layers. The active layer emits first output light in a first output wavelength range, with at least a portion of that light entering the substrate through the first substrate surface. The wavelength-converting layer is on the second surface of the substrate and is less than about 50. microns thick. The wavelength converting layer comprises a multitude of luminescent particles characterized by a D50 less than about 20. microns embedded in a substantially transparent inorganic medium substantially index-matched with the substrate. At least some of the luminescent particles are embedded entirely within the inorganic medium. The luminescent particles absorb incident first output light exiting the substrate and emit second output light in a second output wavelength range different from the first. The optical sidewall coating obstructs lateral propagation of first or second output light exiting the substrate through the sidewalls. The optical sidewall structure is interposed between at least a portion of the substrate sidewalls and the optical sidewall coating, and redirects at least a portion of output light exiting the substrate through the sidewalls to propagate toward or within the wavelength-converting layer.

In some instances, the optical sidewall structure and the wavelength-converting layer can form a single, contiguous structure in direct contact with the second surface and the sidewalls of the substrate. In some instances, an adhering layer can be interposed between the second substrate surface and the wavelength-converting layer and forms with the optical sidewall structure a single, contiguous structure in direct contact with the second surface and the sidewalls of the substrate. In some instances the adhering layer and optical sidewall structure can comprise a multitude of substantially transparent inorganic particles embedded in a substantially transparent inorganic adhering medium substantially index-matched to the substrate. In some other instances the adhering layer and optical sidewall structure can comprise a substantially transparent polymeric medium.

In some instances the maximum thickness of the of the optical sidewall structure can be less than about twice the thickness of the wavelength-converting layer. In some instances the wavelength-converting layer can extend laterally beyond the sidewalls of the substrate by a distance that is less than about twice the thickness of the wavelength-converting layer. In some instances the optical sidewall structure can be tapered, with a maximum thickness at the second substrate surface and decreasing in thickness toward the first substrate surface.

Objects and advantages pertaining to wavelength-converted light-emitting devices may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, the height, depth, or width of certain features (e.g., active layer thickness, phosphor particles, coating thickness, and so on) often can be exaggerated relative to certain other features (e.g., the thickness of a semiconductor layer or a substrate. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the disclosure. The detailed description and drawings illustrate inventive principles by way of example, not by way of limitation.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, "substantially index-matched" indicates that an interface between the two media, materials, or structures in question would exhibit Fresnel reflection at normal incidence less than about 2.0%.

Figure 1:
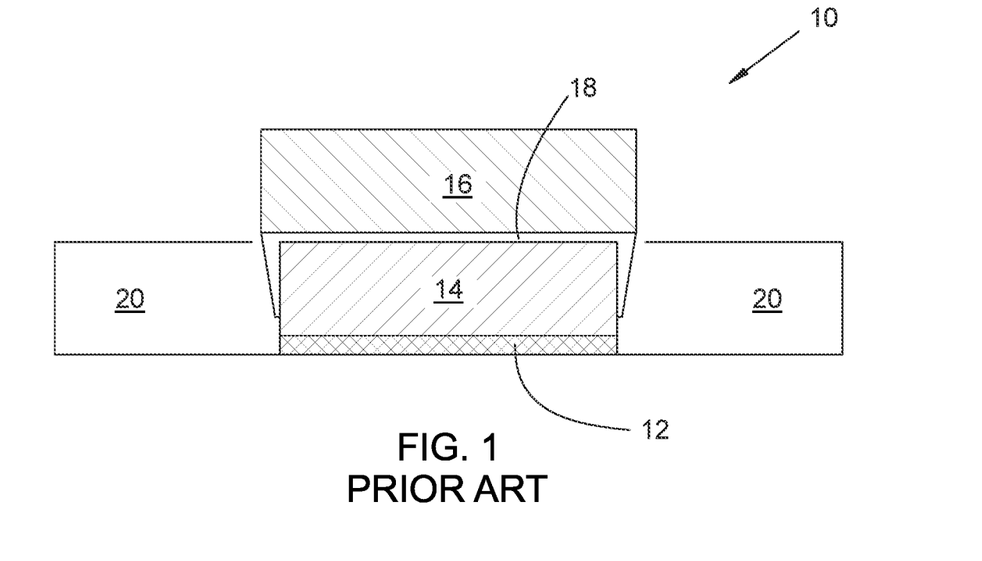
FIG. 1 is a schematic side cross-sectional view of a conventional wavelength-converted light-emitting device.

A conventional arrangement for a wavelength-converted light-emitting device 10 is illustrated schematically in FIG. 1. A semiconductor diode structure 12 is formed on a first surface of a substantially transparent substrate 14. For purposes of the present disclosure and appended claims, "substantially transparent" shall denote a medium, material, or structure that transmits an operationally acceptable fraction of light within an operationally relevant wavelength range. Typical wavelength ranges for the devices disclosed herein fall within the near UV, visible, or near infrared portions of the electromagnetic spectrum, i.e., have a range of vacuum wavelengths that lie between about 0.30 µm and about 2.0 µm (note that a wavelength range of any given device typically is only a small fraction of that overall range). The semiconductor diode structure includes one or more active layers that emit first output light in a first output wavelength range; the emitted first output light propagates within the semiconductor diode structure 12 and some of the first output light exits the semiconductor diode structure 12 and enters the substrate 14. The semiconductor diode structure can include any one or more suitable semiconductor materials to produce the first output light in the desired first wavelength range. Examples of suitable materials can include but are not limited to one or more doped or undoped III-V, II-VI, or Group IV semiconductor materials, or alloys or mixtures thereof. Active layers can include any one or more of those materials arranged in any suitable way, e.g., as a quantum well, multi-quantum well, quantum dots, and so forth.

The substrate 14 has the first surface, a second substrate surface opposite the first surface, and sidewalls connecting the first and second surfaces. The light-emitting device 10, and hence the semiconductor diode structure 12 and the substrate 14, are often square or rectangular, so that the substrate 14 has four distinct sidewalls. This need not be the case, however, and the substrate 14 and its sidewalls can assume any suitable or desirable shape.

A wavelength-converting layer 16 (also referred to as the phosphor layer 16) is on the second surface of the substrate 14, and is adhered to the substrate 14 by adhesive layer 18. The phosphor layer 16 includes luminescent material that absorbs at least a portion of the first output light that propagates within the layer 16 and emits second output light in a second output wavelength range. In some examples the phosphor layer 16 can comprise, e.g., a ceramic YAG film or phosphor material in a glass film. The second wavelength range is different from the first wavelength range, and typically is shifted to longer wavelengths. In some examples the phosphor layer 16 can include only a single luminescent material, while in other examples the layer 16 can include multiple different luminescent materials that emit second output light at different corresponding wavelengths. In some examples the phosphor layer 16 can be arranged to absorb all of the first output light so that optical output of the device 10 includes only the second output light. Alternatively, the layer 16 can be arranged to absorb only a portion of the first output light, so that optical output of the device 10 includes both first and second output light. Any of those arrangements of the phosphor layer 16 can be incorporated into the inventive light-emitting devices described below.

In the conventional device 10, refractive index mismatch between the adhesive layer 18 and one or both of the substrate 14 or the phosphor layer 16 can result in optical loss due to Fresnel reflection at the corresponding interfaces. In the conventional device 10, the substrate 14 and the phosphor layer 16 are each several hundred microns or even a few millimeters thick. A significant fraction of the first output light exits the substrate 14 and phosphor layer 16 through the sidewalls. Typically the phosphor layer 16 is larger in area than the semiconductor diode structure 14, so that there is some "overhang" of the phosphor layer 16 beyond the edges of the semiconductor diode structure 14. The overhang enables the phosphor layer 16 to "catch" and convert at least some of the first output light that exits the substrate through the sidewalls, increasing the total flux of the device 10 (i.e., the total emitted output power). However, increasing the area of the phosphor layer 16 often correspondingly reduces the luminance, which is undesirable in some instances. It is also generally desirable for the light-emitting devices to be smaller rather than larger, for increasing luminance or for overall compactness. The device 10 also includes an optical sidewall coating 20 surrounding the sidewalls of the semiconductor diode structure 12, the substrate 14, and the phosphor layer 16. The optical sidewall coating 20 (e.g., titanium oxide scattering particles in a silicone) obstructs lateral propagation of light the exits the substrate 14 or the phosphor layer 16 through their sidewalls, so that light is emitted by the device 10 over only the desired area, without leaking into adjacent devices or propagating in unwanted directions. Much of that light is lost, however. The thicker is the phosphor layer 16, the more optical sidewall coating material is required to obstruct the unwanted lateral light propagation, driving up overall size, weight, and cost of the device 10.

For at least these reasons, it would be desirable to provide a light-emitting device for which one or more of the following applies: (i) the phosphor layer is as thin as practicable (e.g., less than about 50. microns) to reduce the area of its sidewalls and correspondingly reduce lateral emission from the sidewalls, and to reduce size needed of the optical sidewall coating; (ii) the area of the phosphor layer is only minimally larger than the area of the semiconductor diode structure (e.g., overhang less than about twice the phosphor layer thickness); (iii) an optical structure between the substrate sidewalls and the optical sidewall coating redirects light propagating laterally from the substrate sidewall toward the phosphor layer; or (iv) the phosphor layer, optical structure, or an adhesion layer between the substrate and the phosphor layer are substantially index-matched to the substrate.

Figure 2A:
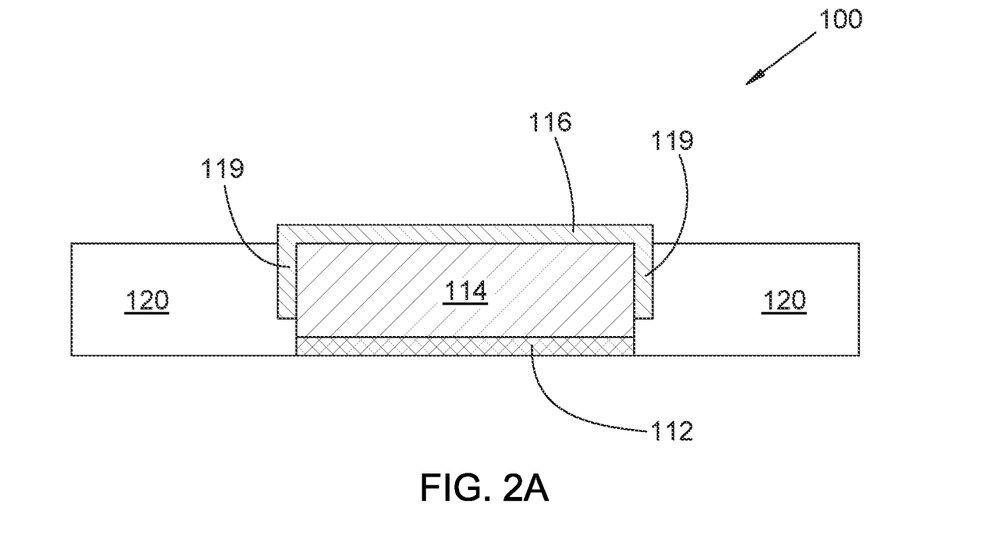
FIG. 2A is a schematic side cross-sectional view of an example of an inventive wavelength-converted light-emitting device.
Figure 2B:
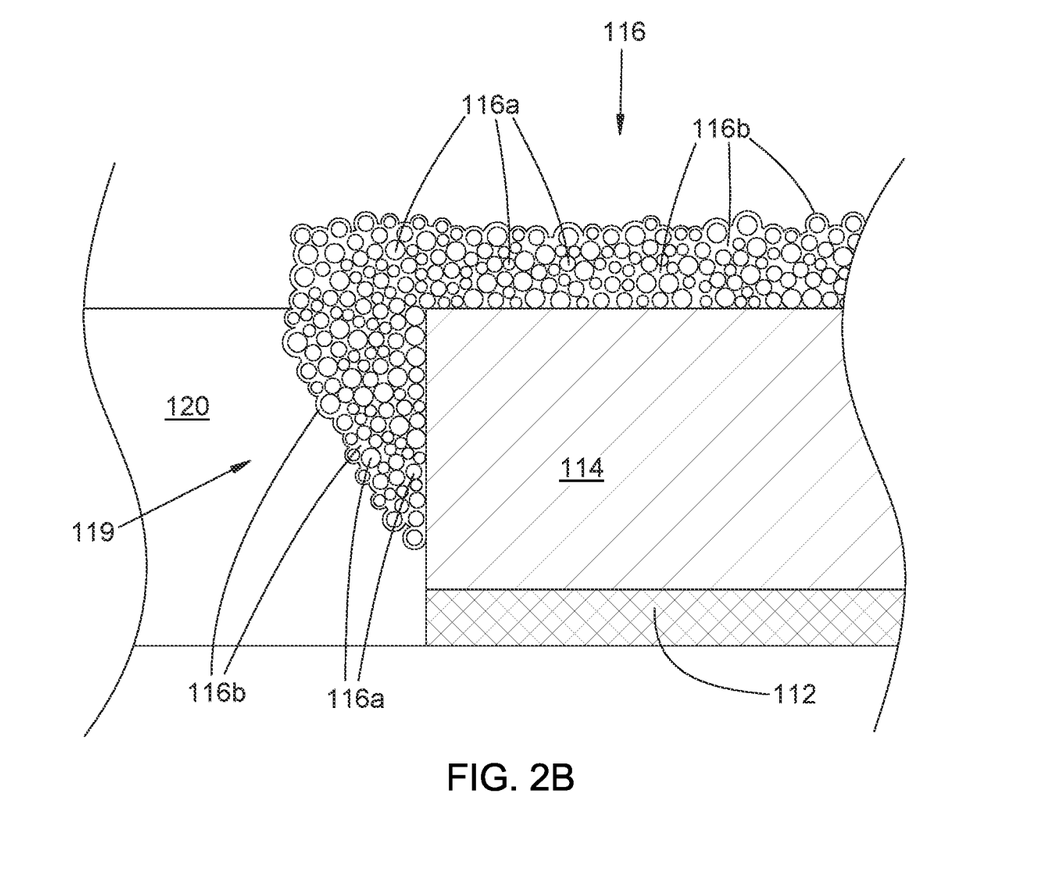
FIG. 2B is an enlargement of a portion of another example of an inventive wavelength-converted light-emitting device.

Examples of an inventive light-emitting device 100 are illustrated schematically in FIGS. 2A and 2B. A semiconductor diode structure 112 is formed on one surface of a substantially transparent substrate 114; a phosphor layer 116 is formed on the opposite surface of the substrate 114 and has a nonzero thickness that is less than about 50. microns. The semiconductor diode structure 112 can be of any suitable type, composition, or construction, as described above. In some examples the nonzero thickness of the phosphor layer 116 can be less than about 40. microns, less than about 30. microns, less than about 20. microns, less than about 15 microns, or less than about 10. microns. The phosphor layer 116 comprises luminescent particles 116a that are characterized by a nonzero D50 (i.e., median transverse particle size) less than about 20. microns. In some examples the luminescent particles 116a can be characterized by a D50 that is greater than about 1.0 microns, greater than about 2.0 microns, greater than about 5 microns, greater than about 10. microns, or greater than about 15 microns. In some examples the luminescent particles 116a can be characterized by a D50 that is less than about 15 microns, less than about 10. microns, less than about 5 microns, or less than about 2.0 microns. The luminescent particles can be of any suitable type or composition (e.g., glass, ceramic, crystalline or polycrystalline, and so forth), and can include any suitable one or more materials that absorb the first output light in the first output wavelength range and emit the second output light in second output wavelength range. In one specific example doped YAG particles are employed to absorb blue first output light and emit yellow or red second output light.

The luminescent particles 116a are bound together and adhered to the substrate 114 by being embedded in a substantially transparent inorganic medium 116b that is substantially index-matched with the substrate 114 (visible in FIG. 2B; layer 116 of FIG. 2A has the same structure, but too small to be seen on the scale of that drawing). At least some of the luminescent particles 116a are embedded entirely within the inorganic medium 116b. In some examples all of the particles 116a are embedded entirely within the inorganic medium 116b; in some other examples some of the particles 116a protrude from the inorganic medium 116b. Any one or more suitable materials can be employed for forming the inorganic medium 116b; suitable examples can include, e.g., semiconductor or metal oxides, nitrides, oxynitrides, or combinations or mixtures thereof. In some examples, the substrate 114 and the inorganic medium 116b have substantially the same chemical composition and so are index-matched. In one specific such example, the substrate can comprise sapphire (i.e., crystalline aluminum oxide) and the inorganic medium 116b can comprise aluminum oxide. Any one or more suitable processes can be employed for forming the phosphor layer 116. In an example of a fabrication method, the luminescent particles 116a can be deposited onto the substrate 114, and then the substrate 114 and the deposited luminescent particles 116a can be coated with the inorganic medium 116b. In some examples a deposition process such as atomic layer deposition (ALD) can be employed to form relatively thin coatings of the inorganic medium 116b on the particles 116a and the substrate 114; in some example the deposited coatings can be between about 0.20 microns thick and about 0.70 microns thick. Such deposition can be arranged to leave voids in the medium 116b among the particles 116a within the phosphor layer 116. The deposition process can be tuned or optimized to yield size distribution or density of such voids in a desired range, to yield desired scattering properties for the layer 116. Scattering by the luminescent particles 116a and any voids present in the layer 116 can be selected to achieve desired, improved, or optimized luminance, light outcoupling, or emission angular distribution.

The phosphor layer 116 is applied directly to the second surface and sidewalls of the substrate 114 somewhat conformally, so that the layer 116 extends at least partly down the sidewalls to form the optical sidewall structure 119 (tapered in the example of FIG. 2B; not tapered in the example of FIG. 2A). The optical sidewall structure 119 and the phosphor layer 116 (i.e., the wavelength-converting layer 116) form a single, contiguous structure, and are in direct contact with the second surface and the sidewalls of the substrate 114, respectively. In some examples the optical sidewall structure 119 extends all the ways to the first substrate surface and substantially covers the sidewalls of the substrate 114; in other examples (including those shown), the optical sidewall structure 119 extends only partway toward the first substrate surface. The optical sidewall structure 119 is arranged to redirect at least a portion output light that exits the substrate 114 through the sidewalls to propagate toward or within the wavelength-converting layer 116.

The optical sidewall coating 120 is arranged to obstruct lateral propagation of output light exiting the substrate 114 through the sidewalls. The optical sidewall structure 119 is interposed between at least a portion of the substrate sidewall and the optical sidewall coating 120. The obstruction of lateral light propagation by the optical sidewall coating 120 can be effected in any suitable way, e.g., using a reflective or scattering coating, layer, or interface between the optical sidewall structure 119 and the optical sidewall coating 120, or by absorption or scattering by bulk material of the optical sidewall coating 120 (e.g., titanium oxide scattering particles dispersed in a silicone binder). In the example of FIGS. 2A/2B a portion of the redirection of light by the optical sidewall structure 119 can be effected by scattering within it by the luminescent particles 116a or voids within the inorganic medium 116b, while another portion of the redirection can be effected by scattering or reflection at the interface with the optical sidewall coating 120.

Figure 3A:
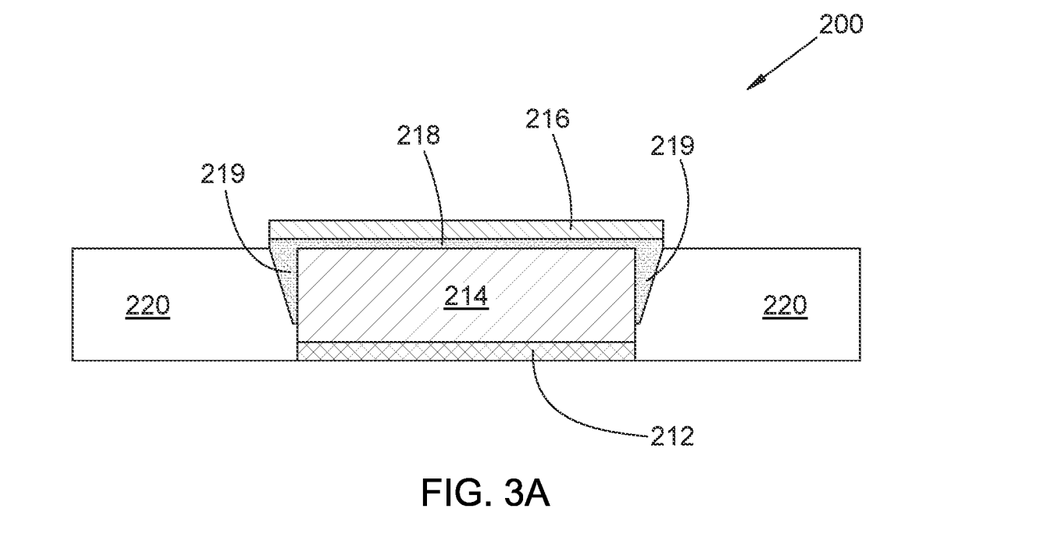
FIG. 3A is a schematic side cross-sectional view of another example of an inventive wavelength-converted light-emitting device.

In FIGS. 3A/3B, another example of an inventive light emitting device 200 includes an adhering layer 218 that is interposed between the second surface of the substrate 214 and the wavelength-converting layer 216. The semiconductor diode structure 212, substrate 214, and phosphor layer 216 (including luminescent particles 216a embedded in the inorganic medium 216b) are substantially as described above. The optical sidewall structure 219 and the adhering layer 218 form a single, contiguous structure, and are in direct contact with the second surface and the sidewalls of the substrate 214, respectively. In this example the adhering layer 218 and the optical sidewall structure 219 comprise a multitude of substantially transparent inorganic particles 218a (represented by stippling in FIGS. 3A and 3B) embedded in a substantially transparent inorganic adhering medium 218b. The particles 218a can be characterized by a nonzero D50 less than about 1.0 microns, or in some examples less than about 0.5 microns. The inorganic adhering medium 218b can be substantially index-matched to the substrate. Any one or more suitable materials can be employed for forming the inorganic particles 218a or the inorganic adhering medium 218b; suitable examples can include, e.g., semiconductor or metal oxides, nitrides, oxynitrides, or combinations or mixtures thereof. In some examples at least two of the substrate 214, the inorganic adhering medium 218b, or the inorganic particles 218a can have substantially the same chemical composition; in some of the those examples all three can have substantially the same chemical composition. In one specific example, the substrate 214 comprises sapphire and one or both of the inorganic adhering medium 218a or the inorganic particles 218b comprise aluminum oxide. The optical sidewall structure 219 and the optical sidewall coating 220 can be arranged as described above. If the adhering medium 218a and the particles 218b have the same chemical composition or are otherwise index-matched, scattering within the optical sidewall structure 219 could be reduced relative to scattering within the optical sidewall structure 119 in the example of FIGS. 2A/2B.

Figure 3B:
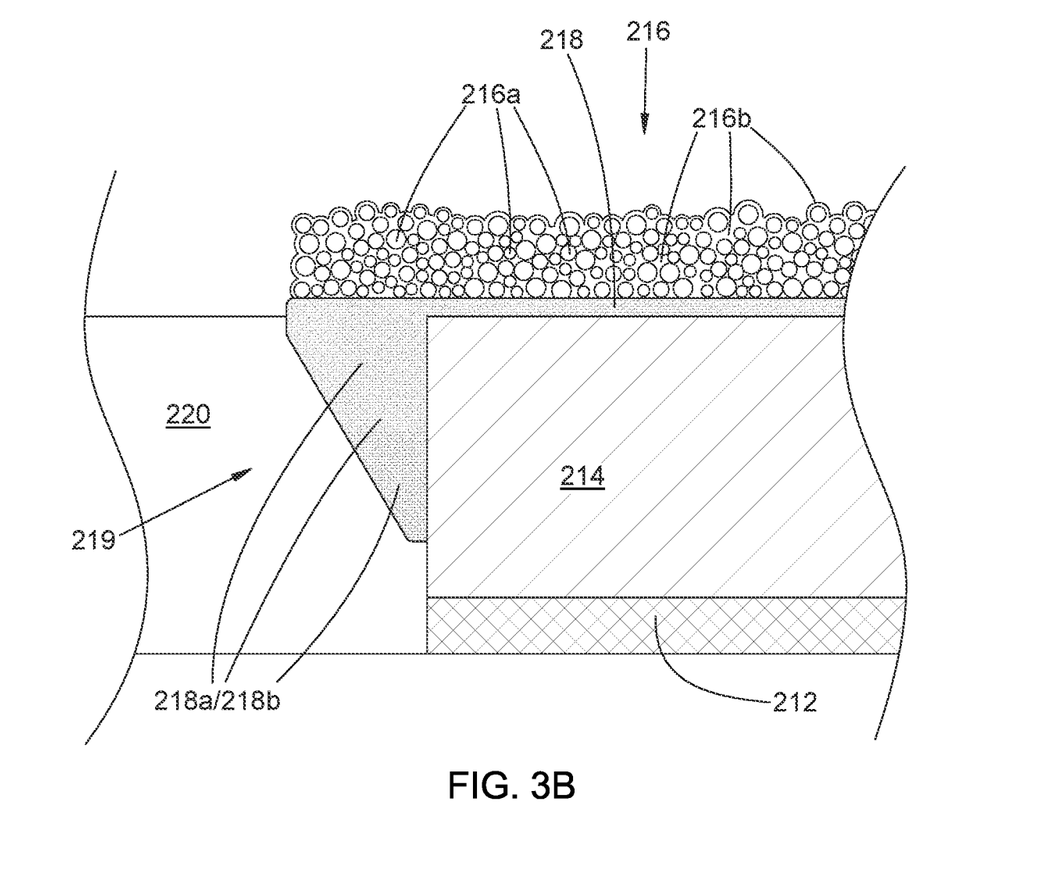
FIG. 3B is an enlargement of a portion of the cross-section of FIG. 3A.

The adhering layer 218 can be formed in a manner similar to that described above for phosphor layer 116, or in any other suitable way. After the adhering layer 218 is formed (and the optical sidewall structure 219), the phosphor layer 216 can be formed, as describe above for phosphor layer 116 or in any other suitable way.

Figure 4A:
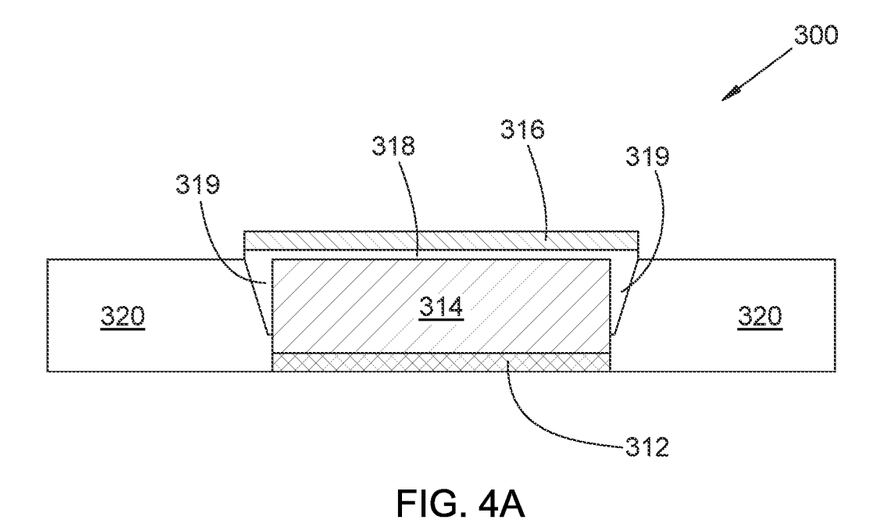
FIG. 4A is a schematic side cross-sectional view of an example of an inventive wavelength-converted light-emitting device.
Figure 4B:
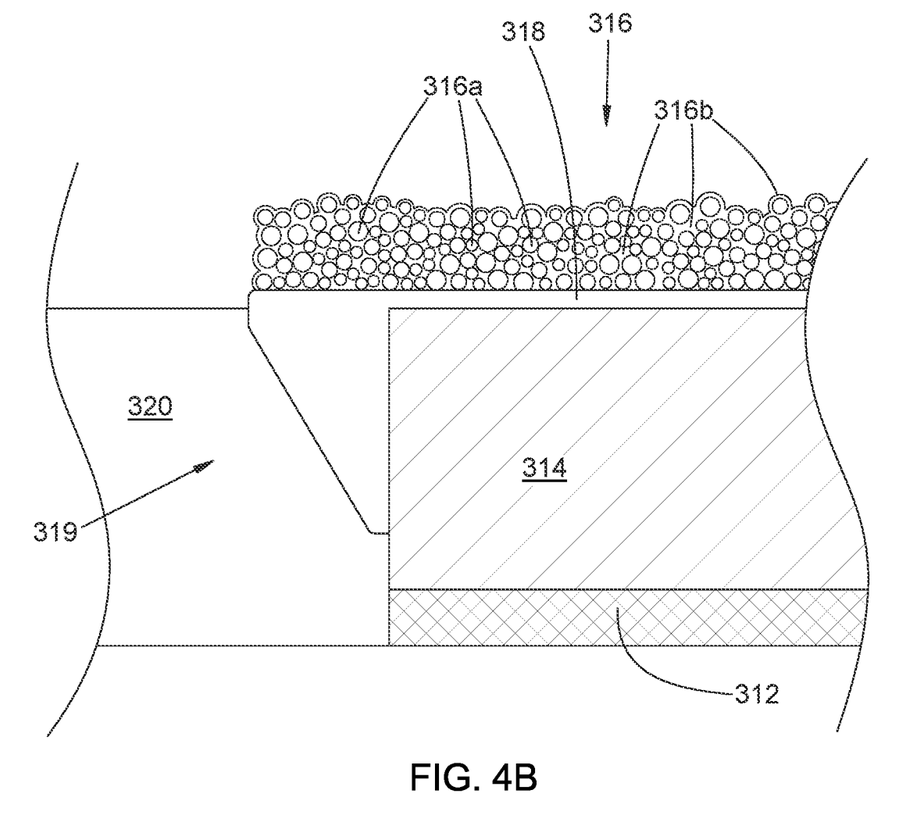
FIG. 4B is an enlargement of a portion of the cross-section of FIG. 4A.

In FIGS. 4A/4B, another example of an inventive light emitting device 300 includes an adhering layer 218 that is interposed between the second surface of the substrate 314 and the wavelength-converting layer 316. The semiconductor diode structure 312, substrate 314, and phosphor layer 316 are substantially as described above. The optical sidewall structure 319 and the adhering layer 318 form a single, contiguous structure, and are in direct contact with the second surface and the sidewalls of the substrate 314, respectively. In this example, the adhering layer 318 comprises a substantially transparent polymeric medium. In some examples the polymeric medium can be substantially index-matched to the substrate 314. In one specific example the adhering layer comprises a silicone. The adhering layer 318 can be applied or deposited in any suitable way. In some examples a liquid or semiliquid polymer precursor is applied and then cured. In some examples, to improve outcoupling of light from the substrate 314 into the phosphor layer 316, the adhering layer 318 can include a multitude of scattering or luminescent particles embedded in the polymeric medium. The optical sidewall structure 319 and the optical sidewall coating 320 can be arranged as described above. In some examples the phosphor layer 316 can be formed as described above, during or after curing of the adhering layer 318; in other examples a preformed phosphor layer 316 can be adhered to the substrate 314 by the adhering layer 318, e.g., during curing of the adhering layer 318.

To limit the area of the phosphor layer 116/216/316, in some examples, the maximum thickness of the of the optical sidewall structure 119/219/319 can be less than about twice the thickness of the phosphor layer 116/216/316; in some of those examples, the maximum thickness of the optical sidewall structure 119/219/319 can be about equal to the thickness of the phosphor layer 116/216/316. In some examples the optical sidewall structure 119/219/319 can be tapered, with a maximum thickness at the second substrate surface and decreasing in thickness toward the first substrate surface (e.g., as in the examples of FIGS. 2B, 3A/3B, and 4A/4B); in other examples the optical sidewall structure 119/219/319 is not tapered (e.g., as in the example of FIG. 2A). To limit the area of the phosphor layer 116/216/316, in some examples the phosphor layer 116/216/316 can extend laterally beyond the sidewalls of the substrate 114/214/314 by a distance that is less than about twice the thickness of the wavelength-converting layer 116/216/316; in some of those examples, the distance is about equal to the thickness of the phosphor layer 116/216/316.

Figure 5:
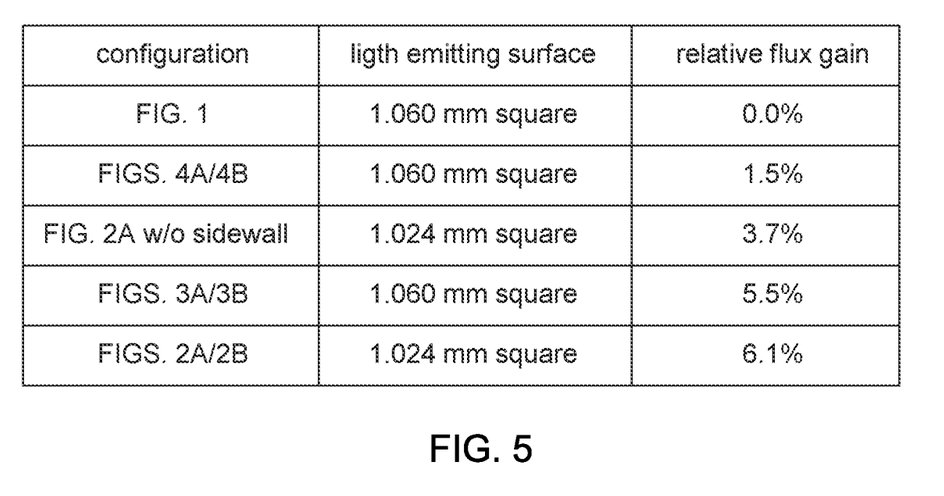
FIG. 5 is a table illustrating performance differences among the example devices of FIGS. 1, 2A/2B, 3A/3B, and 4A/4B.

Examples of improved performance of inventive light emitting devices 100/200/300 relative to the conventional light emitting device 10 are shown in the table of FIG. 5. All three inventive devices 100/200/300 yield increased total flux relative to the conventional device 10 (relative increases of about 1.5% for device 300, 3.7% for a device arranged as in FIG. 2A but without the sidewall structure 119 (not shown), 5.5% for device 200, and 6.1% for device 100). The tested device 100 was slightly smaller than the tested devices 10, 200, and 300, indicating even greater improvement of luminance relative to the conventional device 10 (relative increase of about 13.7% for device 100 relative to device 10).

An example method for making an inventive wavelength-converted light-emitting device 100/200/300 can include (A) forming the semiconductor diode structure 112/212/312 on the first surface of the substrate 114/214/314, (B) forming the wavelength-converting layer 116/216/316 on, or adhering the wavelength converting layer 316 to, the second surface of the substrate 114/214/314, (C) forming the optical sidewall structure 119/219/319, and (D) forming, depositing, or adhering the optical sidewall coating 120/220/320.

To form the example of FIGS. 2A/2B, the method can include depositing the luminescent particles 116a onto the second surface and sidewalls of the substrate 114, and then depositing the inorganic medium 116b onto the second surface and sidewalls of the substrate 114 and the deposited luminescent particles 116a. To form the example of FIGS. 3A/3B, the method can include, before forming the phosphor layer 216, depositing the inorganic particles 218b onto the second surface and sidewalls of the substrate 214, and then depositing the inorganic adhering medium 218b onto the second surface and sidewalls of the substrate 214 and the deposited inorganic particles 218a. To form the example of FIGS. 4A/4B, the method can include, before forming or adhering the phosphor layer 316, depositing the polymeric material onto the second surface and sidewalls of the substrate 314.

In addition to the preceding, the following example embodiments fall within the scope of the present disclosure or appended claims:

Example 1. A wavelength-converted light-emitting device comprising: (a) a substantially transparent substrate having opposite first and second surfaces and sidewalls connecting the first and second surfaces; (b) a semiconductor diode structure on the first surface of the substrate, including one or more light-emitting active layers within the semiconductor diode structure that are arranged so as to emit first output light in a first output wavelength range, at least a portion of the first output light entering the substrate through the first substrate surface; (c) a wavelength-converting layer on the second surface of the substrate and having a nonzero thickness less than about 50. microns, the wavelength converting layer comprising a multitude of luminescent particles characterized by a nonzero D50 less than about 20. microns embedded in a substantially transparent inorganic medium substantially index-matched with the substrate, at least some of the luminescent particles being embedded entirely within the inorganic medium, the luminescent particles absorbing incident first output light exiting the substrate and emitting second output light in a second output wavelength range that differs from the first output wavelength range; (d) an optical sidewall coating arranged so as to obstruct lateral propagation of first or second output light exiting the substrate through the sidewalls; and (e) an optical sidewall structure interposed between at least a portion of the substrate sidewalls and the optical sidewall coating, the optical sidewall structure being arranged so as to redirect at least a portion of first or second output light exiting the substrate through the sidewalls to propagate toward or within the wavelength-converting layer.

Example 2. The device of Example 1, wherein the optical sidewall structure is tapered, having a maximum thickness at the second substrate surface and decreasing in thickness toward the first substrate surface.

Example 3. The device of any one of Examples 1 or 2, wherein the wavelength-converting layer includes a multitude of voids that result in optical scattering of light propagating within the wavelength-converting layer.

Example 4. The device of any one of Examples 1 through 3, wherein the substrate and the inorganic medium have substantially the same chemical composition.

Example 5. The device of Example 4, wherein the substrate comprises sapphire and the inorganic medium comprises aluminum oxide.

Example 6. The device of any one of Examples 1 through 5, wherein the optical sidewall structure and the wavelength-converting layer form a single, contiguous structure, and are in direct contact with the second surface and the sidewalls of the substrate, respectively.

Example 7. The device of any one of Examples 1 through 5, wherein an adhering layer is interposed between the second substrate surface and the wavelength-converting layer, and the optical sidewall structure and the adhering layer form a single, contiguous structure, and are in direct contact with the second surface and the sidewalls of the substrate, respectively.

Example 8. The device of Example 7, the adhering layer comprising a multitude of substantially transparent inorganic particles characterized by a nonzero D50 less than about 1.0 µm embedded in a substantially transparent inorganic adhering medium substantially index-matched to the substrate.

Example 9. The device of Example 8, wherein at least two, or all three, of the substrate, the inorganic adhering medium, or the inorganic particles have substantially the same chemical composition.

Example 10. The device of Example 9, wherein the substrate comprises sapphire and one or both of the inorganic adhering medium or the inorganic particles comprise aluminum oxide.

Example 11. The device of Example 7, wherein the adhering layer comprises a substantially transparent polymeric medium.

Example 12. The device of Example 11, wherein the polymeric medium is substantially index-matched to the substrate.

Example 13. The device of any one of Examples 11 or 12, wherein the adhering layer includes a multitude of scattering or luminescent particles embedded in the polymeric medium.

Example 14. The device of any one of Examples 1 through 13, wherein the maximum thickness of the of the optical sidewall structure is less than about twice the thickness of the wavelength-converting layer.

Example 15. The device of any one of Examples 1 through 14, wherein the wavelength-converting layer extends laterally beyond the sidewalls of the substrate by a distance that is less than about twice the thickness of the wavelength-converting layer.

Example 16. A method for making the device of any one of Examples 1 through 15, the method comprising: (A) forming the semiconductor diode structure on the first surface of the substrate; (B) forming the wavelength-converting layer on, or adhering the wavelength converting layer to, the second surface of the substrate; (C) forming the optical sidewall structure; and (D) forming, depositing, or adhering the optical sidewall coating.

Example 17. A method for making a wavelength-converted light-emitting device, the method comprising: (A) forming a semiconductor diode structure on a first surface of a substantially transparent substrate having opposite first and second surfaces and sidewalls connecting the first and second surfaces, the semiconductor diode structure including one or more light-emitting active layers within the semiconductor diode structure that are arranged so as to emit first output light in a first output wavelength range, at least a portion of the first output light entering the substrate through the first substrate surface; (B) forming a wavelength-converting layer on, or adhering the wavelength converting layer to, the second surface of the substrate, the wavelength-converting layer having a nonzero thickness less than about 50. microns and comprising a multitude of luminescent particles characterized by a nonzero D50 less than about 20. microns embedded in a substantially transparent inorganic medium substantially index-matched with the substrate, at least some of the luminescent particles being embedded entirely within the inorganic medium, the luminescent particles absorbing incident first output light exiting the substrate and emitting second output light in a second output wavelength range that differs from the first output wavelength range; (C) forming on at least a portion of the substrate sidewalls an optical sidewall structure arranged so as to redirect at least a portion of first or second output light exiting the substrate through the sidewalls to propagate toward or within the wavelength-converting layer; and (D) forming, depositing, or adhering an optical sidewall coating with the optical sidewall structure interposed between at least a portion of the substrate sidewalls and the optical sidewall coating, the optical sidewall coating being arranged so as to obstruct lateral propagation of first or second output light exiting the substrate through the sidewalls.

Example 18. The method of Example 17, wherein the optical sidewall structure and the wavelength-converting layer form a single, contiguous structure, and are formed by deposition of the luminescent particles onto the second surface and sidewalls of the substrate followed by deposition of the inorganic medium onto the second surface and sidewalls of the substrate and the deposited luminescent particles.

Example 19. The method of Example 17, further comprising forming an adhering layer on the second surface of the substrate before forming or adhering the wavelength-converting layer, wherein the optical sidewall structure and the adhering layer form a single, contiguous structure, and are formed by deposition of substantially transparent inorganic particles onto the second surface and sidewalls of the substrate, followed by deposition of a substantially transparent inorganic adhering medium onto the second surface and sidewalls of the substrate and the deposited inorganic particles, the inorganic particles being characterized by a nonzero D50 less than about 1.0 μm, and the inorganic adhering medium being substantially index-matched to the substrate.

Example 20. The method of Example 17, further comprising forming an adhering layer on the second surface of the substrate before forming or adhering the wavelength-converting layer, wherein the optical sidewall structure and the adhering layer form a single, contiguous structure, and are formed by deposition of substantially transparent polymeric material onto the second surface and sidewalls of the substrate, the polymeric material being substantially index-matched to the substrate.

Example 21. The method of any one of Examples 17 through 20, wherein the maximum thickness of the optical sidewall structure is less than about twice the thickness of the wavelength-converting layer, or the wavelength-converting layer extends laterally beyond the sidewalls of the substrate by a distance that is less than about twice the thickness of the wavelength-converting layer.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A wavelength-converted light-emitting device comprising:
   a transparent substrate having opposite first and second surfaces and sidewalls connecting the first and second surfaces;
   a semiconductor diode structure on the first surface of the substrate, including one or more light-emitting active layers that are arranged so as to emit first output light in a first output wavelength range, at least a portion of the first output light entering the substrate through the first substrate surface;
   a wavelength-converting layer on the second surface of the substrate and having a nonzero thickness less than about 50. microns, the wavelength converting layer comprising a multitude of luminescent particles characterized by a nonzero D50 less than about 20. microns embedded in a transparent inorganic medium substantially index-matched with the substrate, at least some of the luminescent particles being embedded entirely within the inorganic medium, the luminescent particles absorbing incident first output light exiting the substrate and emitting second output light in a second output wavelength range that differs from the first output wavelength range;
   an optical sidewall coating arranged so as to obstruct lateral propagation of first or second output light exiting the substrate through the sidewalls;
   an optical sidewall structure that is interposed between at least a portion of the substrate sidewalls and the optical sidewall coating and arranged so as to redirect at least a portion of first or second output light exiting the substrate through the sidewalls to propagate toward or within the wavelength-converting layer; and
   an adhering layer interposed between the second substrate surface and the wavelength-converting layer, the optical sidewall structure and the adhering layer forming a single, continuous structure, and being in direct contact with the second surface and the sidewalls of the substrate, respectively, the adhering layer and the optical sidewall structure comprising a multitude of transparent inorganic particles characterized by a nonzero D50 less than about 1.0 μm embedded in a transparent inorganic adhering medium substantially index-matched to the substrate.

2. The device of claim 1, the optical sidewall structure being tapered, having a maximum thickness at the second substrate surface and decreasing in thickness toward the first substrate surface.

3. The device of claim 1, at least two, or all three, of the substrate, the inorganic adhering medium, or the inorganic particles having substantially the same chemical composition.

4. The device of claim 3, the substrate comprising sapphire and one or both of the inorganic adhering medium or the inorganic particles comprising aluminum oxide.

5. The device of claim 1, the inorganic adhering medium comprising a transparent polymeric medium.

6. The device of claim 1, the wavelength-converting layer including a multitude of voids that result in optical scattering of light propagating within the wavelength-converting layer.

7. The device of claim 1, (i) maximum thickness of the of the optical sidewall structure being less than about twice the thickness of the wavelength-converting layer, or (ii) the wavelength-converting layer extending laterally beyond the sidewalls of the substrate by a distance that is less than about twice the maximum thickness of the wavelength-converting layer.

8. The device of claim 1, the substrate and the inorganic medium having substantially the same chemical composition.

9. The device of claim 8, the substrate comprising sapphire and the inorganic medium comprising aluminum oxide.

10. A method for making a wavelength-converted light-emitting device, the method comprising:
   forming a semiconductor diode structure on a first surface of a substantially transparent substrate having opposite first and second surfaces and sidewalls connecting the first and second surfaces, the semiconductor diode structure including one or more light-emitting active layers within the semiconductor diode structure that are arranged so as to emit first output light in a first output wavelength range, at least a portion of the first output light entering the substrate through the first substrate surface;
   forming (i) an adhering layer on the second substrate surface and (ii) an optical sidewall structure on at least a portion of the substrate sidewalls, the optical sidewall structure and the adhering layer forming a single, continuous structure, and being in direct contact with the second surface and the sidewalls of the substrate, respectively, the adhering layer and the optical sidewall structure comprising a multitude of transparent inorganic particles characterized by a nonzero D50 less than about 1.0 μm embedded in a transparent inorganic adhering medium substantially index-matched to the substrate, the optical sidewall structure being arranged so as to redirect at least a portion of first or second output light exiting the substrate through the sidewalls to propagate toward or within the wavelength-converting layer; and forming a wavelength-converting layer on, or adhering the wavelength converting layer to, the adhering layer, the wavelength-converting layer having a nonzero thickness less than about 50. microns and comprising a multitude of luminescent particles characterized by a nonzero D50 less than about 20. microns embedded in a substantially transparent inorganic medium substantially index-matched with the substrate, at least some of the luminescent particles being embedded entirely within the inorganic medium, the luminescent particles absorbing incident first output light exiting the substrate and emitting second output light in a second output wavelength range that differs from the first output wavelength range.

11. The method of claim 10, the optical sidewall structure and the adhering layer being formed by deposition of substantially transparent inorganic particles onto the second surface and sidewalls of the substrate, followed by deposition of a substantially transparent inorganic adhering medium onto the second surface and sidewalls of the substrate and the deposited inorganic particles.

12. The method of claim 10, the wavelength-converting layer being formed by deposition of the luminescent particles onto the adhering layer followed by deposition of the inorganic medium onto the adhering layer and the deposited luminescent particles.

13. The method of claim 10, at least two, or all three, of the substrate, the inorganic adhering medium, or the inorganic particles having substantially the same chemical composition.

14. The method of claim 13, the substrate comprising sapphire and one or both of the inorganic adhering medium or the inorganic particles comprising aluminum oxide.

15. The method of claim 10, the inorganic adhering medium comprising a transparent polymeric medium.

16. The method of claim 10, the wavelength-converting layer including a multitude of voids that result in optical scattering of light propagating within the wavelength-converting layer.

17. The method of claim 10, (i) maximum thickness of the of the optical sidewall structure being less than about twice the thickness of the wavelength-converting layer, or (ii) the wavelength-converting layer extending laterally beyond the sidewalls of the substrate by a distance that is less than about twice the maximum thickness of the wavelength-converting layer.

18. The method of claim 10, the substrate and the inorganic medium having substantially the same chemical composition.

19. The method of claim 18, the substrate comprising sapphire and the inorganic medium comprising aluminum oxide.

* * * * *